(12) United States Patent
Hsieh et al.

(10) Patent No.: US 8,055,233 B2
(45) Date of Patent: Nov. 8, 2011

(54) HIGH LINEARITY PASSIVE MIXER AND METHOD THEREOF

(75) Inventors: Hong Yean Hsieh, Kaohsiung (TW); Chao-Cheng Lee, Hsinchu (TW); Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 783 days.

(21) Appl. No.: 12/108,509

(22) Filed: Apr. 24, 2008

(65) Prior Publication Data

US 2008/0268805 A1 Oct. 30, 2008

Related U.S. Application Data

(60) Provisional application No. 60/913,543, filed on Apr. 24, 2007.

(51) Int. Cl.
*H04B 1/18* (2006.01)
(52) U.S. Cl. .................. 455/293; 455/295; 455/310
(58) Field of Classification Search .......... 455/254–255, 455/283–284, 290, 292, 293, 295, 296, 310, 455/317, 323, 324–326
See application file for complete search history.

(56) References Cited

U.S. PATENT DOCUMENTS

| 4,113,996 | A * | 9/1978 | Sanderson | 379/405 |
| 6,889,037 | B2 | 5/2005 | Darabl | |
| 7,107,025 | B2 * | 9/2006 | Khorram | 455/118 |
| 7,254,380 | B2 | 8/2007 | Kuei-Ann et al. | |
| 2008/0268805 | A1 * | 10/2008 | Hsieh et al. | 455/293 |

FOREIGN PATENT DOCUMENTS

TW I241077 10/2005

OTHER PUBLICATIONS

H. Ramiah and T. Z. A. Zulklifli, "High Linearity 0.18μm CMOS Mixer with Current Draining Technique," IEEE TENCON, pp. 1-5, Nov. 2005.
K. Dufrene adn R. Weigel, "IP2 and DC Offset Turning in Current Mode Output Down Conversion Mixers," IEEE Symp. RFIC, Jun. 2006.

* cited by examiner

*Primary Examiner* — Christian Hannon
(74) *Attorney, Agent, or Firm* — Thomas, Kayden, Horstemeyer & Risley, LLP

(57) ABSTRACT

A high linearity mixer circuit includes a commutation network comprising four switches to provide an electrical coupling between a first pair of circuit nodes and a second pair of circuit nodes, whereas the coupling has two states and is controlled by a pair of complementary logical signals. The mixer circuit further comprises a first pair of current-sourcing devices coupled to the first pair of circuit nodes and a second pair of current-sourcing devices coupled to the second pair of circuit nodes. The mixer circuit further includes a pair of capacitors to provide AC coupling, either between the first pair of circuit nodes and a first external circuit, or between the second pair of circuit nodes and a second external circuit.

21 Claims, 8 Drawing Sheets

HIGH LINEARITY PASSIVE MIXER AND METHOD THEREOF

CROSS REFERENCE TO RELATED APPLICATIONS

This application claims the benefit of U.S. Provisional Application No. 60/913,543, filed on Apr. 24, 2007 and entitled "HIGH LINEARITY PASSIVE MIXER AND METHOD THEREOF", the contents of which are incorporated herein by reference.

FIELD OF THE INVENTION

The invention is related to passive mixer circuits for use in communication systems. In particular, this invention relates to an apparatus and method for improving linearity of a mixer circuit.

BACKGROUND OF THE INVENTION

Mixers are an important circuit for radio frequency (RF) transmitters and receivers. The function of a mixer is to perform a frequency translation. While the present invention is generally related to and applicable to a variety of RF transmitters and receivers, one of applications is so-called direct-conversion receiver, which is also known as a homodyne receiver. In a direct-conversion receiver, a mixer is used to convert an RF signal into a baseband signal by mixing the RF signal with a clock signal, which is usually referred to as a local oscillator (LO) signal. The frequency of the LO signal is nominally the same as the center frequency of the RF signal, and consequently the resultant baseband signal is centered at DC. In a twist known as a low-IF (intermediate frequency) receiver, which is also relevant to the present invention, the frequency of the LO signal is slightly different from the center frequency of the RF signal, and consequently the resultant baseband signal is centered at a low intermediate frequency. By way of example but not limitation, a down-conversion mixer suitable for direct-conversion receivers or low-IF receivers is used to describe the related art and to demonstrate how the present invention can be applied to improve the performance over the related art.

There are numerous topologies to construct a mixer circuit. A topology of particular relevance to the present invention is based on commutating a differential signal in a manner controlled by a differential LO signal. FIG. 1 depicts a commutation network 100. On one side, the commutation network 100 is coupled to an input differential signal comprised of VI+ and VI−; on the other side, it is coupled to an output differential signal comprised of VO+ and VO−. The commutation network 100 comprises four switches, embodied by four NMOS (N-type metal-oxide semiconductor) field-effect transistors M1, M2, M3, and M4, respectively. The commutation network 100 receives a differential LO signal comprised of VLO+ and VLO−. Each switch is controlled by either VLO+ or VLO−. Each switch is closed when its controlling signal is high, and open otherwise. Note that VLO+ and VLO− are complementary: when VLO+ is high, VLO− is low; and when VLO+ is low, VLO− is high. As a result, when VLO+ is high (and therefore VLO− is low), VI+ and VI− are coupled to VO+ and VO− via M1 and M3, respectively; when VLO+ is low (and therefore VLO− is high), VI+ and VI− are coupled to VO− and VO+ via M2 and M4, respectively. Consequently, the output differential signal (VO+-VO−) is approximately equivalent to the input differential signal (VI+-VI−) multiplied by 1 (when VLO+ is high) or −1 (when VLO+ is low). Therefore, the output either tracks the input, or tracks the inversion of the input, depending on the state of the LO signal. In a direct-down conversion application, the input differential signal represents the RF signal, and the output differential signal represents the baseband signal, which is approximately equal to the RF signal multiplied by the LO signal.

Many mixer circuits are constructed using the commutation network 100 of FIG. 1. Among them, a mixer is generally classified as "active" if there is a DC (direct current) flowing between the input side and the output side. On the other hand, a mixer is generally classified as "passive" if there is no DC flowing between the input side and the output side. FIG. 2 depicts a prior art passive mixer 200 based on using a commutation network 210. On one side, instead of directly coupling the commutation network 210 to the input differential signal comprised of VI+ and VI−, a pair of capacitors C3 and C4 are used to provide AC (alternate current) coupling. On the other side, a termination network (for examples: a pair of parallel RC networks, R1-C1 and R2-C2) is used to provide termination for the output differential signal comprised of VO+ and VO−. Here, VCM is a DC voltage provided to set the common-mode voltage for the output differential signal VO+ and VO−. Due to the AC coupling capacitors C3 and C4, there is no DC flowing between the input side and the output side. Since there is no DC flowing between the two sides of the commutation network 210, passive mixer 200 allows separate biasing conditions for both sides of networks. This offers an advantage in flexibility that is lacked in an active mixer, where both sides of networks cannot be biased separately due to the DC flowing between them.

There is a problem with the prior art passive mixer 200. Under a static bias condition, for each of the four MOS transistors (M1 to M4), both sides of its terminals are biased to the common-mode voltage VCM. A MOS transistor provides a channel for current to flow between a first terminal and a second terminal, where a third terminal (i.e. the "gate") controls the conductivity of the channel. The channel, however, is symmetrical and there is no physical difference between the first terminal and a second terminal. The current can flow from the first terminal to the second terminal, and vice versa. Between the first terminal and the second terminal, one is defined as the "source" and the other is defined as the "drain," depending on the direction of the current flow. Under a static bias condition, there is no current flowing in any of the four MOS transistors for the prior art passive mixer 200. Under a dynamic condition where an AC (alternating current) RF signal is applied to the input side, there is an AC flowing in each of the four MOS transistors whenever its respective controlling signal (VLO+ or VLO−) is high. Since the current flow is alternating in nature, the definition of source and drain is also alternating. When the current flow changes direction, the roles of the previously "source" and the previously "drain" are also reversed. This phenomenon is called drain-source reversal phenomenon, or reversal phenomenon for short. The conductivity of the channel is primarily determined by the voltage difference between the gate and the source. Whenever the reversal phenomenon takes place, there is usually an abrupt change in the conductivity of the channel. This leads to distortion to the output signal.

What is needed is a method to alleviate the adverse effect of the reversal phenomenon.

SUMMARY OF THE INVENTION

Therefore, one of the objectives of the present invention is to provide a mixer circuit to solve the above-mentioned problems.

In an embodiment, a mixer circuit is disclosed. The mixer circuit includes a commutation network comprising four switches to provide an electrical coupling between a first pair of circuit nodes and a second pair of circuit nodes, whereas the coupling has two states and is controlled by a pair of complementary logical signals. The mixer circuit further comprises a first pair of current-sourcing devices coupled to the first pair of circuit nodes and a second pair of current-sourcing devices coupled to the second pair of circuit nodes. The mixer circuit further includes a pair of capacitors to provide AC coupling, either between the first pair of circuit nodes and a first external circuit, or between the second pair of circuit nodes and a second external circuit. In a further embodiment, an additional commutation network is inserted between the second pair of current-sourcing devices and the second pair of circuit nodes to provide an electrical coupling that has two states controlled by a pair of complementary clock signals. In a further embodiment, the second pair of current-sourcing devices is replaced by a plurality of pairs of current-sourcing devices coupled to the second pair of circuit nodes via a plurality of commutation networks controlled by a plurality of complementary clock signal pairs, respectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated in and from a part of this specification, illustrate embodiments of the invention and, together with the description, serve to explain the principles of the invention.

DETAILED DESCRIPTION OF PREFERRED EMBODIMENTS

The various features and advantageous details of the invention thereof are explained more fully with reference to the inventive embodiments that are illustrated in the accompanying drawings and detailed in the following description. However, it will be obvious to one skilled in the art that the present invention may be practiced without these specific details. Descriptions of well-known components and processing techniques are omitted so as not to unnecessarily obscure the invention in detail.

First Embodiment

The present invention discloses a method to alleviate the adverse effect of the reversal phenomenon in a passive mixer.

Figure 1:
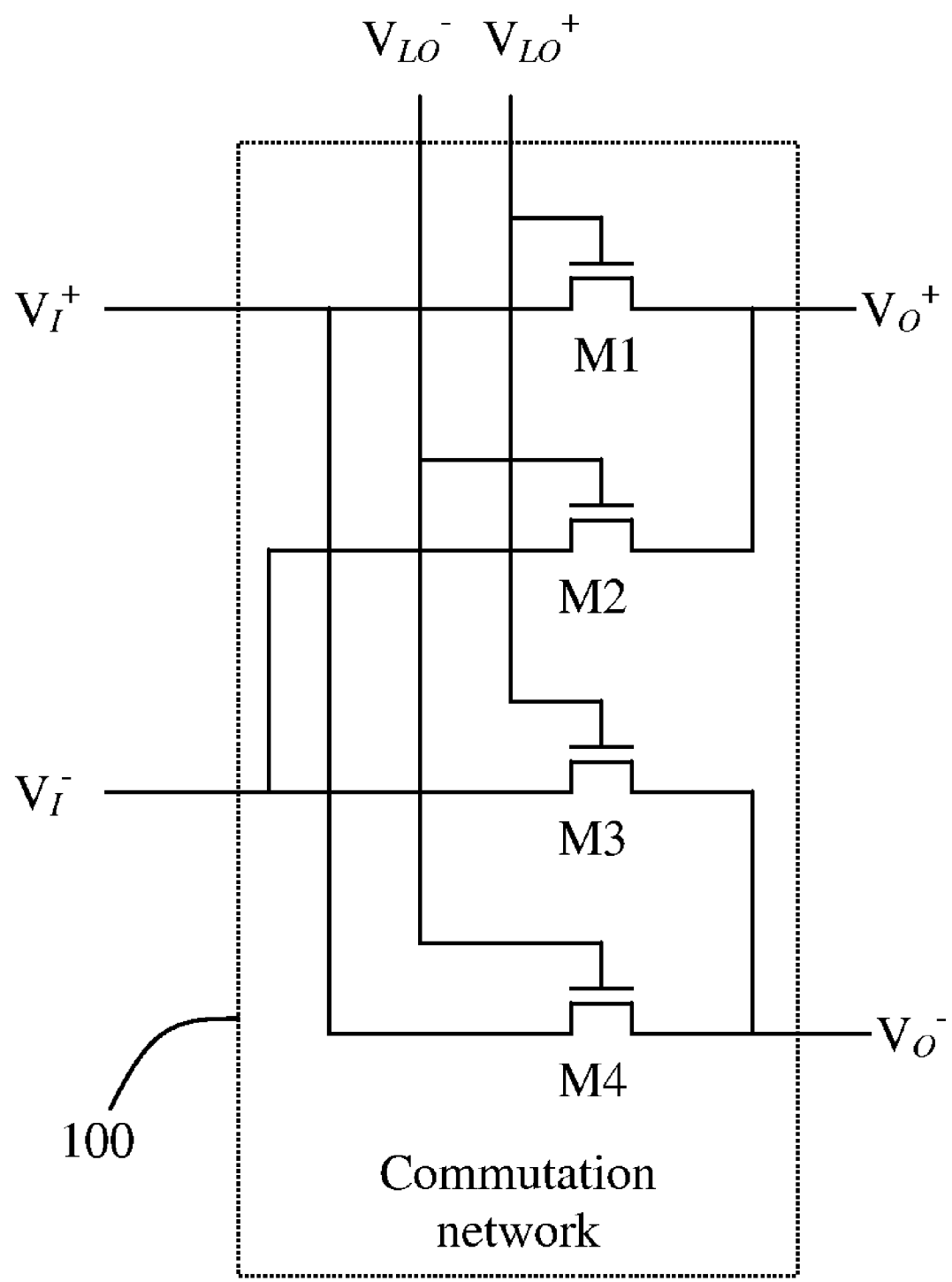
FIG. 1 illustrates a schematic diagram of a commutation network.
Figure 2:
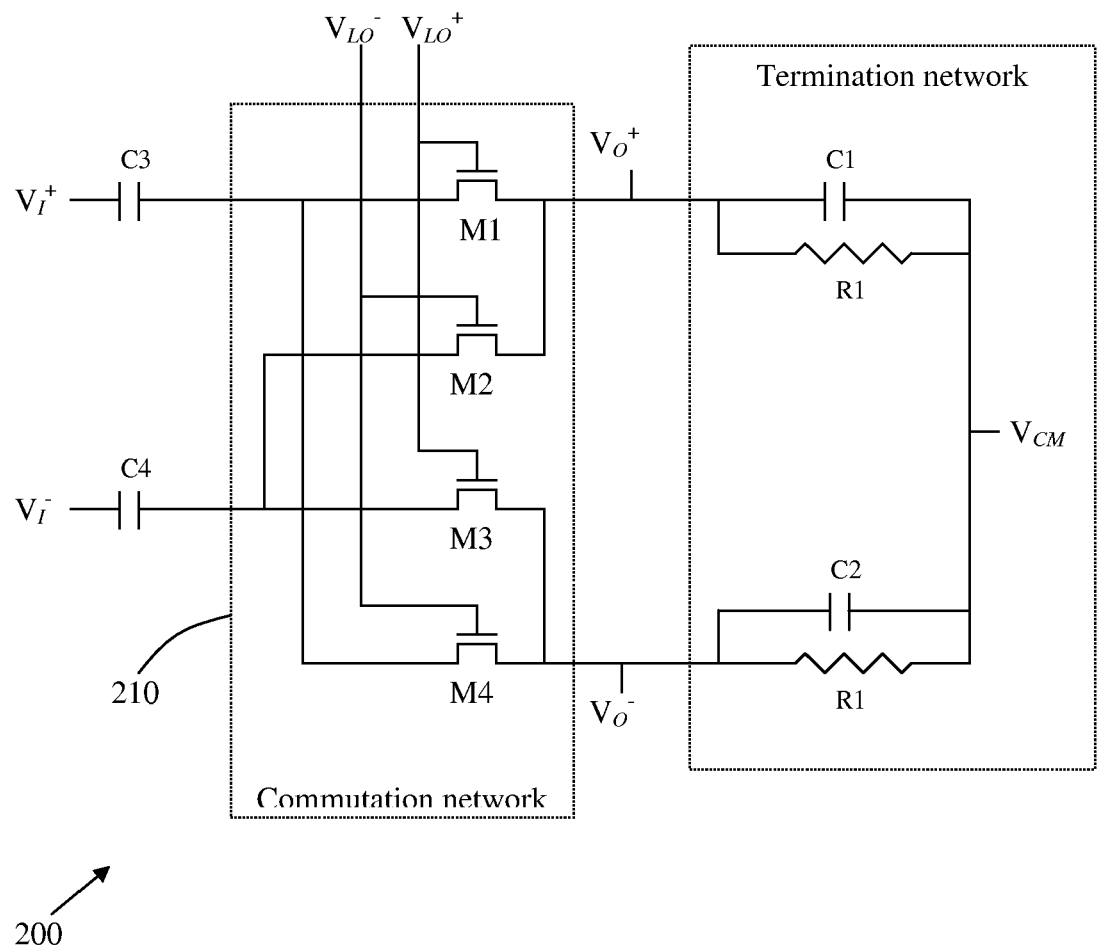
FIG. 2 illustrates a schematic diagram of a prior art passive mixer.
Figure 3:
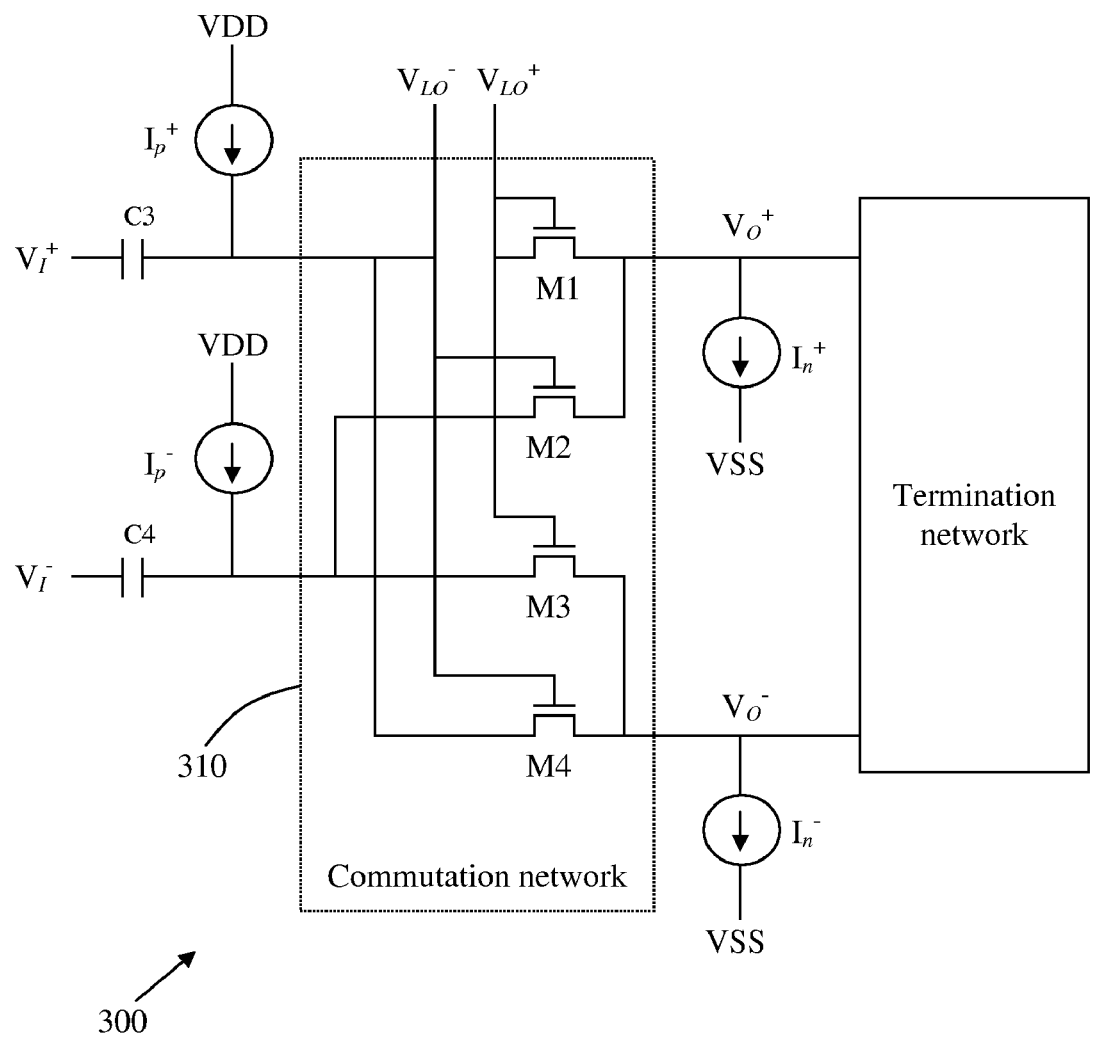
FIG. 3 depicts a first embodiment of a passive mixer in accordance with the present invention.

A first embodiment 300 in accordance with the present invention is depicted in FIG. 3. The embodiment 300 comprises a commutation network 310, on one side coupled to a differential input differential signal comprised of VI+ and VI− via two AC coupling capacitors C3 and C4, and on the other side coupled to a differential termination network that provides termination for a differential output signal comprised of VO+ and VO−. The termination network includes an internal common-mode control circuit (not shown in the figure) so that under a static bias condition both VO+ and VO− are equal to a common-mode DC voltage VCM. The termination network can be a pair of R-C circuits (see FIG. 2). Alternatively, it can be a differential operational amplifier configured in a negative feedback topology using two feedback resistors. A common-mode feedback circuit is utilized to establish the common-mode voltage VCM at the output of the operational amplifier. The same common-mode voltage VCM is fed back through the two resistors and thus established on VO+ and VO−.

The first embodiment further comprises a pair of current sources Ip+ and Ip− and a pair of current sinks In+ and In−. The two current sources Ip+ and Ip− respectively inject currents into the two input terminals of the commutation network, while the two current sinks In+ and In− respectively drain currents from the two output terminals of the commutation network. Here, VDD and VSS denote two different DC voltages, where VDD is higher than VCM and VSS is lower than VCM. The two current sources Ip+ and Ip− inject substantially the same amount of current; the two current sinks In+ and In− drain substantially the same amount of current; and the amount of current injected by Ip+ and Ip− is substantially equal to the amount of current drained by In+ and In−. The amount of current, injected or drained, is chosen such that in the presence of an input AC signal, the current flow mostly stays in the same direction for each of the four MOS transistors (M1, M2, M3, and M4) within the commutation network 310. In this manner, the roles of "source" and "drain" are fixed or nearly fixed in the presence of the input AC signal, and the adverse effect of the reversal phenomenon is alleviated.

Figure 4:
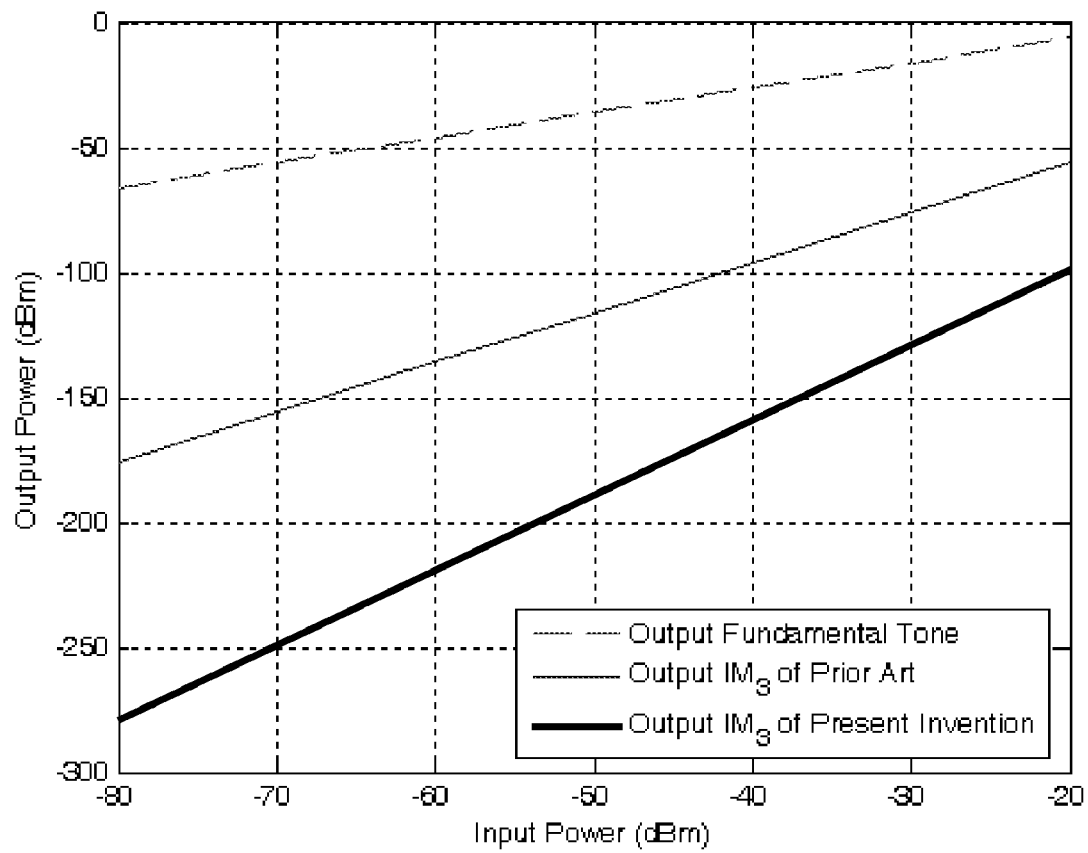
FIG. 4 depicts a simulation result that demonstrates the improvement of the present invention over the prior art.

To demonstrate the improvement achieved by using the current invention, a simulation is conducted for both the prior art mixer 200 of FIG. 2 and the first embodiment 300 of FIG. 3. In the simulation, the input RF signal comprises two tones, one at 406 MHz and the other at 408 MHz, of equal power, and the LO signal is a 400 MHz clock. The output baseband signal contains two fundamental tones of substantially equal power, one at 6 MHz and the other at 8 MHz, and also contains two 3rd order inter-modulation (IM3) tones of substantially equal power, one at 4 MHz and the other at 10 MHz. FIG. 4 shows three traces of the simulation result. The first trace shows the power of the two fundamental tones (at 6 MHz and 8 MHz) as a function of the power of the two input tones (at 406 MHz and 408 MHz). It is clear that the two fundamental tones exhibit 10 dB increases in power in response to 10 dB increases in the power of the two input tones. The second trace shows the power of the two IM3 tones (at 4 MHz and 10 MHz) as a function of the power of the two input tones for the prior art mixer 200. It is clear that the two IM3 tones exhibit 20 dB increases in power in response to 10 dB increases in the power of the two input tones. This is quite different from that in an active mixer, where the two IM3 tones usually exhibit 30 dB increases in power in response to 10 dB increases in the power of the two input tones. The difference is attributed to the adverse effect of the reversal phenomenon. The third trace shows the power of the two IM3 tones as a function of the power of the two input tones for the first embodiment 300. The two IM3 tones exhibit 30 dB increases in power in response to 10 dB increases in the power of the two input tones. This demonstrates the adverse effect of the reversal phenomenon in the prior art passive mixer is essentially removed thanks to the arrangement in the first embodiment 300.

There are numerous alternative embodiments to this first embodiment 300. For example:

1. Instead of injecting currents into the input side of the commutation network 310 and draining currents from the output side, one can choose to inject currents into the output side and drain currents from the input side. The reversal phenomenon can also be avoided in this manner, only that the current flow stays in the opposite direction.

2. Instead of using the current sink pair In+ and In− to drain current, one can choose to replace the current sink pair by a resistor pair. The value of the two resistors, however, needs be carefully chosen such that the resistor pair drains substantially the same amount of current as drained by the current sink pair.

3. Instead of using the current source pair Ip+ and Ip− to inject current, one can choose to replace the current source pair by a resistor pair. The value of the two resistors, however, needs be carefully chosen such that the resistor pair injects substantially the same amount of current as injected by the current sink pair.

4. Instead of using AC coupling on the input side, one may choose to use AC coupling on the output side. In this case, the source network that provides the input differential signal VI+ and VI− needs to have a common-mode control network so that under a static bias condition both VI+ and VI− are equal to a common-mode DC voltage VCM. This alternative embodiment is particularly useful for direct up-conversion application where the source network is a baseband circuit comprising a differential operational amplifier that utilizes a common-mode feedback circuit to establish the common-mode DC voltage.

5. Instead of using a NMOS transistor to implement a switch, one can choose to use a PMOS (P-type MOS) transistor to implement a switch. Alternatively, one can also use a NMOS transistor in parallel with a PMOS transistor to implement a switch. Note that, the controlling signal of a PMOS transistor needs to be logically complementary to that of a NMOS transistor, so that the PMOS transistor will be in the same state as the NMOS transistor. Besides, one can also choose to use other semiconductor devices to implement a switch, e.g. BJT (bipolar junction transistor), HBT (heterojunction bipolar transistor), HEMT (high electron mobility transistor), and so on.

Here, we use "current source" to refer to a device that injects an outgoing current (or generates a positive current) and use "current sink" to refer to a device that drains an incoming current (or generates a negative current). However, in some literature, both types are generally referred to as a current source, regardless of the polarity of current flow. Since many alternative embodiments of the present invention are based on changing the polarity of the static current flow for the MOS transistors, in the claims both types are generally referred to as a "current-sourcing device" to secure the scope of claims.

This first embodiment can be applied to any mixer application, for either up-conversion or down-conversion purpose. However, there is potentially a problem when it is applied to a direct down-conversion receiver or a low-IF receiver. Both direct down-conversion receivers and low-IF receiver receivers contain low-frequency components in the signal of interest at the mixer output. As well known in the literature, a current source (or sink) implemented by a semiconductor device is prone to generating an excessive amount of a low-frequency noise known as "flicker noise." In particular, the current sink pair In+ and In− that drains current from the output side of the commutation network generates a flicker noise, which is superposed on the output differential output signal VO+ and VO−. This flicker noise may seriously degrade the quality of the signal of interest. In a second embodiment in accordance with the present invention, this problem is alleviated.

Second Embodiment

Figure 5A:
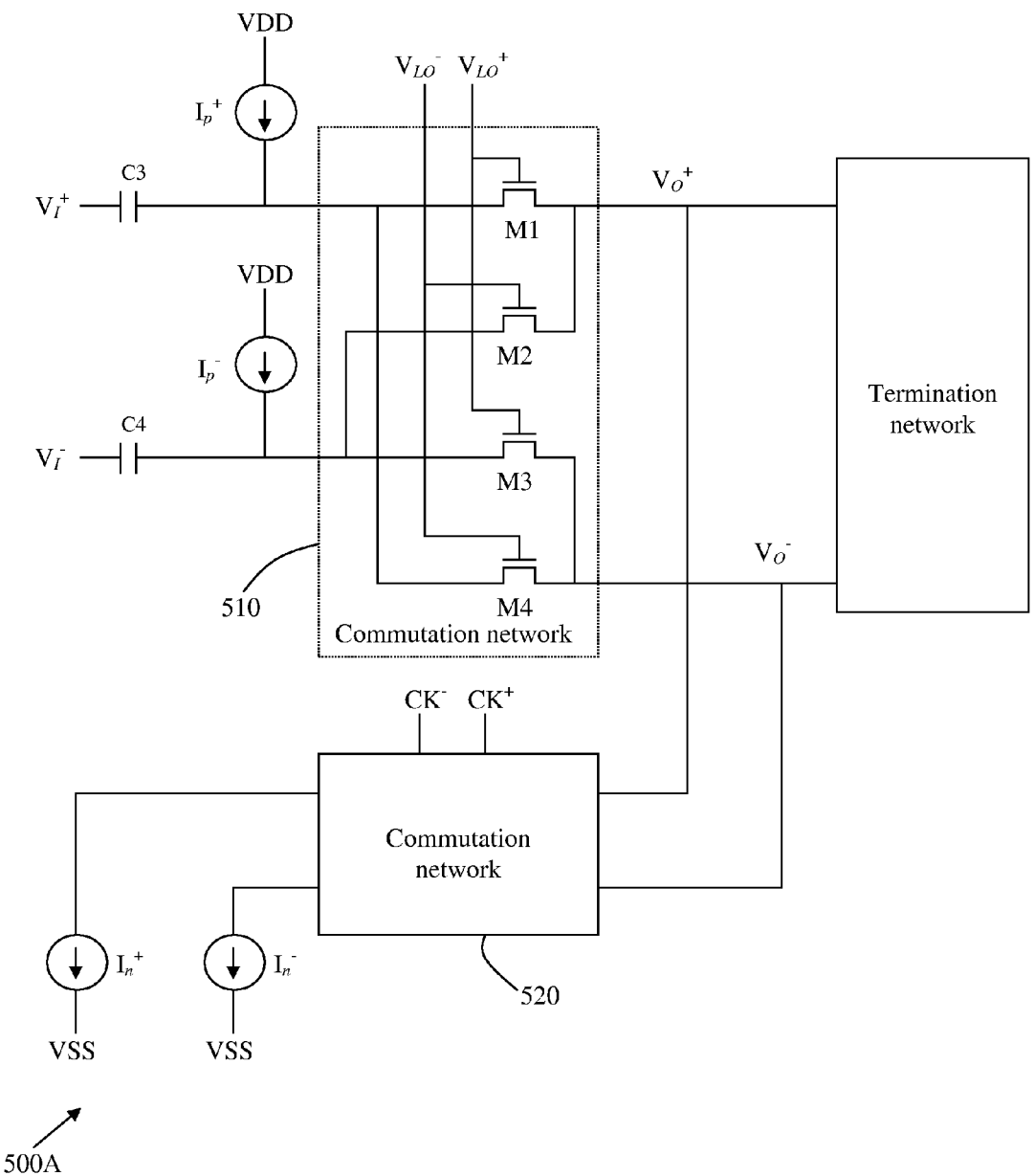
FIG. 5A depicts a second embodiment of a passive mixer in accordance with the present invention.

A second embodiment 500A in accordance with the present invention is depicted in FIG. 5A. The second embodiment 500A is the same as the first embodiment 300 of FIG. 3 except that: instead of directly draining currents from VO+ and VO− using the two current sinks In+ and In−, a second commutation network 520 is inserted to commutate the current draining. The second commutation network 520 is controlled by a pair of complementary logical signals CK+ and CK−. When CK+ is high (and therefore CK− is low), In+ and In− drain currents from VO+ and VO−, respectively; when CK+ is low (and therefore CK− is high), In+ and In− drain currents from VO− and VO+, respectively. The flicker noise generated from In+ and In− is thus modulated by the complementary logical signals before being superposed to the differential output VO+-VO−. In one embodiment, the frequency of the complementary logical signal pair CK+ and CK− is much higher than the frequency or frequencies of the signal of interest at the mixer output. The low-frequency flicker noise is thus modulated into a high-frequency noise that is out of signal band of interest and its adverse effect is thus alleviated.

Although the second embodiment 500A can effectively alleviate the problem caused by the flicker noise generated by the current sink pair In+ and In−, a glitch occurs whenever the complementary logical signal pair (CK+ and CK−) toggles its state. This glitch will likely degrade the mixer performance. To address this issue, a third embodiment is disclosed as follows.

Third Embodiment

Figure 5B:
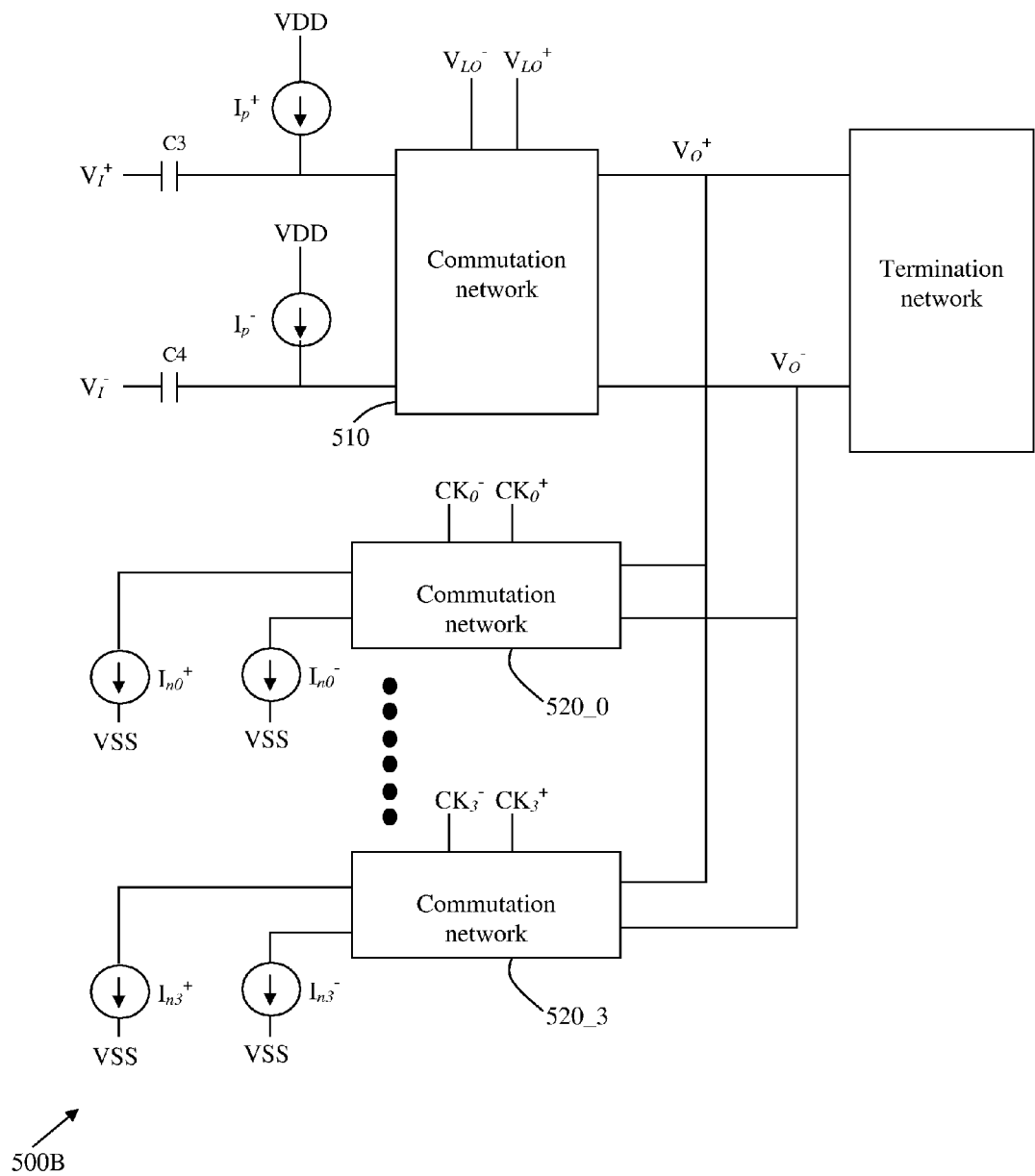
FIG. 5B depicts a third embodiment of a passive mixer in accordance with the present invention.
Figure 5C:
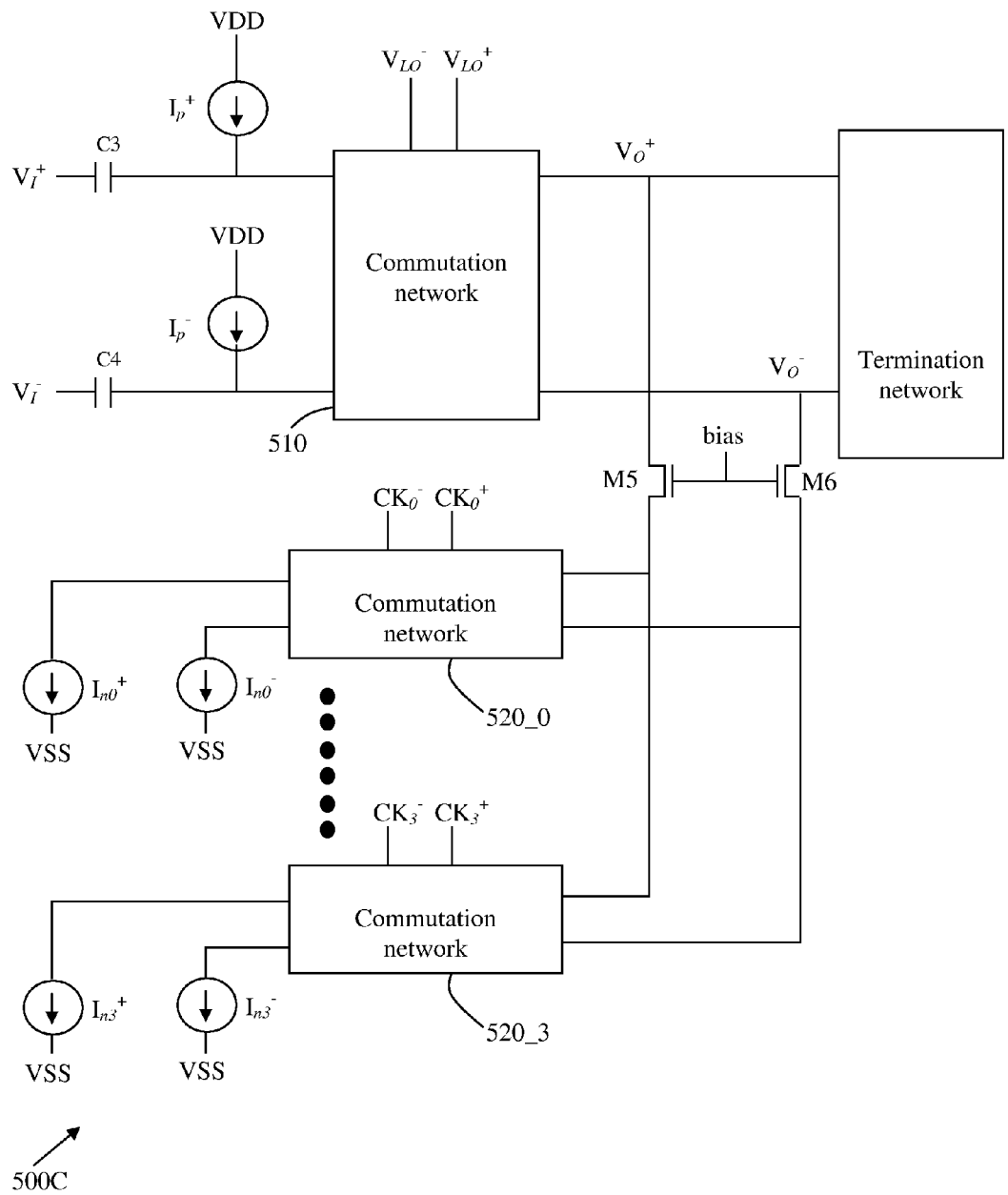
FIG. 5C depicts an alternative embodiment to the third embodiment of FIG. 5B.

A third embodiment 500B in accordance with the present invention is depicted in FIG. 5B. The third embodiment 500B is the same as the second embodiment 500A of FIG. 5A except that: instead of using the two current sinks In+ and In− to drain currents from VO+ and VO− via the commutation network 520 controlled by a pair of complementary logical signals CK+ and CK−, one uses a plurality of current sink pairs to drain currents from VO+ and VO− via a plurality of commutation networks controlled by a plurality of pairs of complementary logical signals, respectively. By way of example but not limitation, FIG. 5B shows four current sink pairs (labeled from In0± to In3±) that drain currents from VO+ and VO− via four commutation networks (labeled from 520_0 to 520_3) controlled by four pairs of complementary logical signals (labeled from CK0± to CK3±), respectively. Each current sink pair includes two current sinks that drain substantially the same amount of current. One has to properly choose the amount of currents for those four current sink pairs such that the total amount of current drained by those four current pairs equals the amount of current drained by the lone current sink pair In+ and In− in the second embodiment 500A in FIG. 5A. At any time instant, therefore, the total current drained from VO+ (or VO−) by the eight current sink pairs is the same as that drained by the only current sink pair In+ and In− in the second embodiment 500A in FIG. 5A, regardless of the states of the four pairs of complementary logical signals. As a result, the third embodiment 500B is as effective as the second embodiment 500A in terms of alleviating the reversal phenomenon. In an alternative embodiment depicted in FIG. 5C, one inserts a pair of cascode transistors M5 and M6 to provide an isolation between the output nodes (VO+ and VO−) and the four commutation networks.

Figure 6:
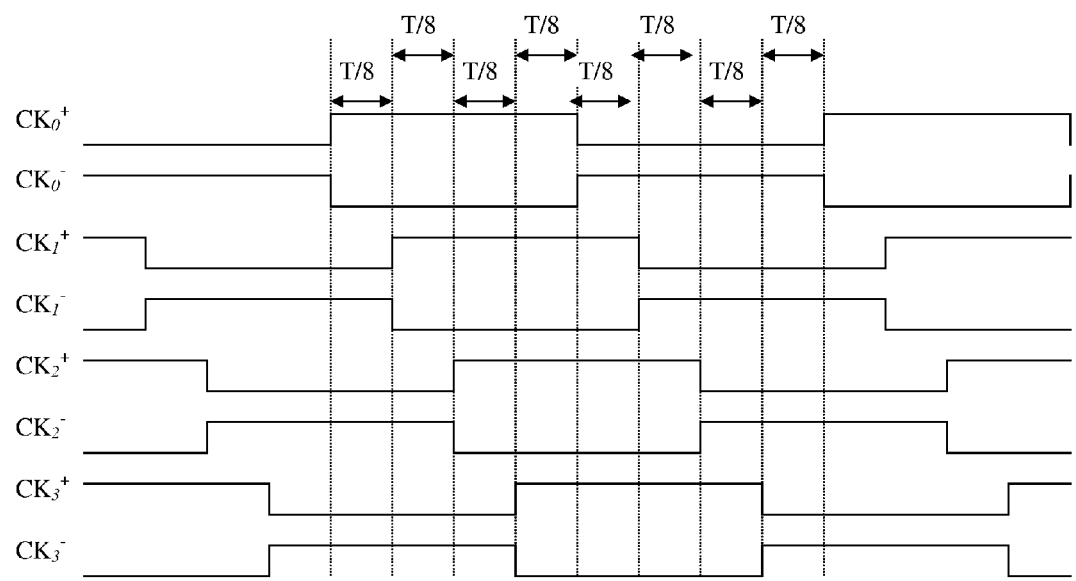
FIG. 6 depicts a timing diagram of four complementary logical signal pairs constructed from an 8-phase clock.

While preserving the merit of alleviating the reversal phenomenon, the third embodiment allows one to reduce the adverse effect of glitch upon current sink commutating. In a preferred embodiment, the four current sink pairs all drain substantially the same amount of current, and their timings of commutation are uniformly spaced. In other words, the four current sink pairs are sequentially commutated. This can be achieved by employing an 8-phase clock signal to construct the four complementary logical signal pairs. An exemplary timing diagram for the four complementary logical signal pairs constructed from an 8-phase clock is shown in FIG. 6, where T denotes a clock period. In this manner, the four current sink pairs are commutated sequentially in a time-interleaved manner. Although the glitch occurs four times more frequently (than in the second embodiment 500A of FIG. 5), the adverse effect of each glitch is much less due to less amount of current involved in each commutation.

Alternative Embodiments

The principle disclosed in this present invention can be practiced in numerous alternative embodiments without departing from the scope of the invention. Those of ordinary skill in the art can freely insert, for instance, a pair of resistors on either side of the mixer's core commutation network (that is, 310 of FIG. 3, and 510 of FIGS. 5A, 5B, and 5C) to provide a certain degree of isolation between the input side and the output side of the mixer. A NMOS transistor can be replaced by a PMOS transistor, and vice versa, at the discretion of the circuit designer, as long as the functionality is preserved. A current source can be replaced by a current sink, and vice versa, at the discretion of the circuit designer, as long as the functionality is preserved. A current source (or sink) can even be replaced by a resistor at the discretion of the circuit designer, as long as the functionality is preserved. At the discretion of the circuit designer, a pair of cascode transistors with proper biasing can be inserted in the two branches of a differential circuit to provide isolation (see M5 and M6 of FIG. 5C). An alternative switch circuit (PMOS switch, transmission gates, etc) can be used to replace a NMOS switch at the discretion of the circuit designer.

For the second embodiments (see FIG. 5A), one can choose to insert another commutation network (controlled by another pair of complementary logical signals) between the two current sources Ip+ and Ip− and the input ends VI+ and VI−. This makes the circuits on both side of the mixer core 510 nearly a mirror image to each other. For the third embodiments (FIGS. 5B, and 5C), likewise, one can choose to replace the current source pair Ip+ and Ip− with a plurality of current source pairs injecting currents into VI+ and VI− via a plurality of commutation networks controlled by a plurality of complementary logical signals. Besides, AC coupling can be used on either side of the mixer circuit, or it can even be used on both sides of the mixer circuit.

In this disclosure, the term "logical signal" and also the term "clock signal" are used to describe an electrical signal that has two possible states. In particular, it describes a signal that is either of a high voltage or of a low voltage at a given time instant. Those of ordinary skill in the art would understand that: in practice, an electrical signal cannot toggle instantly from a low voltage to a high voltage, or vice versa. There is always a period of transition for every occasion of toggling of state, during which the electrical signal is not strictly in a high state or in a low state. It should be understood that, the principle of this present invention could still be practiced under such a non-ideal condition, albeit a potential degradation in performance due to the non-ideality needs to be taken into account.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A mixer comprising:
   a first commutation network comprising four switches to provide an electrical coupling between a first pair of circuit nodes and a second pair of circuit nodes, wherein the four switches are controlled by a first pair of complementary logical signals;
   a first pair of current-sourcing devices coupled to the first pair of circuit nodes;
   a second pair of current-sourcing devices coupled to the second pair of circuit nodes; and
   a termination network coupled to the second pair of circuit nodes, the four switches coupled between the first pair of current-sourcing devices and the second pair of current-sourcing devices.

2. The mixer of claim 1, further comprising:
   a pair of capacitors to provide AC coupling to one of the first pair of circuit nodes and the second pair of circuit nodes.

3. The mixer of claim 2, further comprising:
   at least one second commutation network coupled between the second pair of current-sourcing devices and the second pair of circuit nodes, wherein the at least one second commutation network is controlled by a second pair of complementary logical signals.

4. The mixer of claim 2, wherein the frequency of the second pair of the complementary logical signal is much higher than the frequency of an output signal of the mixer.

5. The mixer of claim 2, the second pair of current-sourcing devices comprising:
   a plurality of second commutation networks coupled to the second pair of circuit nodes and controlled by a plurality of pairs of complementary logical signals, respectively;
   a plurality of pairs of current-sourcing units, wherein each of pairs of current-sourcing units is coupled to the corresponding second commutation network.

6. The mixer of claim 5, wherein each of the plurality of pairs of current-sourcing units includes two current cells that provide substantially the same amount of current.

7. The mixer of claim 2, wherein the termination network comprises a pair of parallel RC networks.

8. The mixer of claim 1, further comprising:
   at least one second commutation network coupled between the second pair of current-sourcing devices and the second pair of circuit nodes, wherein the at least one second commutation network is controlled by a second pair of complementary logical signals.

9. The mixer of claim 8, wherein the frequency of the second pair of the complementary logical signal is much higher than the frequency of an output signal of the mixer.

10. The mixer of claim 8, wherein the termination network comprises a pair of parallel RC networks.

11. The mixer of claim 1, the second pair of current-sourcing devices comprising:

a plurality of second commutation networks coupled to the second pair of circuit nodes and controlled by a plurality of pairs of complementary logical signals, respectively;

a plurality of pairs of current-sourcing units, wherein each of pairs of current-sourcing units is coupled to the corresponding second commutation network.

12. The mixer of claim 1, wherein the amount of current provided by the first pair of current-sourcing devices is substantially equal to the amount of current provided by the second pair of current-sourcing devices.

13. The mixer of claim 1, wherein the termination network comprises a common-mode control circuit.

14. The mixer of claim 1, wherein the termination network comprises a differential operational amplifier configured in a negative feedback topology using two feedback resistors.

15. A mixing method comprising:

providing an electrical coupling between a first pair of circuit nodes and a second pair of circuit nodes via four switches, wherein the four switches are controlled by a first pair of complementary logical signals;

providing a first pair of currents of a first pair of current-sourcing devices into the first pair of circuit nodes;

providing a second pair of currents of a second pair of current-sourcing devices into the second pair of circuit nodes; and outputting an output signal from the second pair of circuit nodes, the four switches coupled between the first pair of current-sourcing devices and the second pair of current-sourcing devices.

16. The method of claim 15, further comprising:

providing a pair of capacitors to provide AC coupling to one of the first pair of circuit nodes and the second pair of circuit nodes.

17. The method of claim 15, wherein the second pair of currents are provided according to a second pair of complementary logical signals.

18. The method of claim 15, wherein the frequency of the second pair of the complementary logical signal is much higher than the frequency of the output signal.

19. The method of claim 15, the second pair of current-sourcing devices comprising:

a plurality of second commutation networks coupled to the second pair of circuit nodes and controlled by a plurality of pairs of complementary logical signals, respectively;

a plurality of pairs of current-sourcing units, wherein each of pairs of current-sourcing units is coupled to the corresponding second commutation network.

20. The method of claim 19, wherein each of the plurality of pairs of current-sourcing units includes of two current cells that provide substantially the same amount of current.

21. The method of claim 15, wherein the amount of current provided by the first pair of current-sourcing devices is substantially equal to the amount of current provided by the second pair of current-sourcing devices.

* * * * *